US006450346B1

(12) United States Patent
Boyle et al.

(10) Patent No.: US 6,450,346 B1
(45) Date of Patent: *Sep. 17, 2002

(54) SILICON FIXTURES FOR SUPPORTING WAFERS DURING THERMAL PROCESSING

(75) Inventors: James E. Boyle, Saratoga; Robert L. Davis, Belmont, both of CA (US); Laurence D. Delaney, Whitefish, MT (US); Raanan Y. Zehavi, Sunnyvale, CA (US)

(73) Assignee: Integrated Materials, Inc., San Jose, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 09/608,557

(22) Filed: Jun. 30, 2000

(51) Int. Cl.$^7$ ............................................... A47G 19/08
(52) U.S. Cl. ..................... 211/41.18; 206/454; 118/500; 118/728; 432/258
(58) Field of Search ....................... 211/41.18; 206/454; 118/500, 728; 432/253, 258, 259

(56) References Cited

U.S. PATENT DOCUMENTS

| | | | |
|---|---|---|---|
| 3,640,398 A | | 2/1972 | Loxley et al. ................. 211/41 |
| 4,091,919 A | * | 5/1978 | MacLeod et al. ........ 206/454 X |
| 4,171,740 A | * | 10/1979 | Clement et al. ......... 206/454 X |
| 4,318,749 A | | 3/1982 | Mayer ......................... 134/25.4 |
| 4,566,839 A | | 1/1986 | Butler ......................... 414/404 |
| 4,872,554 A | | 10/1989 | Quernemoen ............... 206/454 |
| 4,914,269 A | | 4/1990 | Kinsman et al. ........ 219/121.64 |
| 4,966,549 A | | 10/1990 | Ohdate ........................ 532/253 |
| 5,020,476 A | | 6/1991 | Bay et al. ................... 118/728 |
| 5,468,297 A | | 11/1995 | Letort ......................... 118/728 |

(List continued on next page.)

FOREIGN PATENT DOCUMENTS

| | | |
|---|---|---|
| EP | 0506052 A1 | 9/1992 |
| EP | 0 807 961 A1 | 11/1997 |
| EP | 0 884 769 A1 | 12/1998 |
| EP | 1 006 564 A1 | 7/2000 |
| GB | 1385730 | 2/1975 |
| WO | WO 00/21119 | 4/2000 |

OTHER PUBLICATIONS

"Onformation about Silicon Furnace Tubes," Dow corning, no date, 4 pp.
"Polyboat: Series 7700," Semiconductor Specialties Corp., no date, pp. 1–24.
"1979 Catalog Supplement," Semiconductor Specialties Corp., no date, 3 pp.

Primary Examiner—Robert W. Gibson, Jr.
(74) Attorney, Agent, or Firm—Charles S. Guenzer

(57) ABSTRACT

A silicon tower or boat for removably supporting a plurality of silicon wafers during thermal processing. A preferred embodiment of the tower includes four legs secured on their ends to two bases. A plurality of slots are cut in the legs allowing slidable insertion of the wafers and support for them. The legs preferably have a rounded wedge shape with a curved front surface of small radius cut with the slots and a back surface that is either flat or curved with a substantially larger radius. Preferably, the legs are machined from virgin polysilicon formed by chemical vapor deposition from silane. The bases may be either virgin poly or monocrystalline silicon and be either integral or composed of multiple parts. Virgin polysilicon is preferably annealed to above 1025° C. before machining. Silicon parts may be joined by applying a spin-on glass between the parts and annealing the assembly. After assembly, the surface of a tower is subjected to sub-surface working.

47 Claims, 5 Drawing Sheets

U.S. PATENT DOCUMENTS

| | | | |
|---|---|---|---|
| 5,492,229 A | 2/1996 | Tanaka | 211/41 |
| 5,534,074 A | 7/1996 | Koons | 118/728 |
| 5,586,880 A | 12/1996 | Ohsawa | 432/241 |
| 5,595,604 A | 1/1997 | Kobayashi et al. | 118/715 |
| 5,658,103 A | 8/1997 | Inokuchi et al. | 408/145 |
| 5,752,609 A | 5/1998 | Kato et al. | 211/41.18 |
| 5,779,797 A | 7/1998 | Kitano | 118/500 |
| 5,820,683 A | 10/1998 | Ishii et al. | 118/728 |
| D404,371 S | 1/1999 | Shimazu | D13/182 |
| 5,858,103 A | 1/1999 | Nakajima et al. | 118/728 |
| D411,176 S | 6/1999 | Shimazu | D13/182 |
| 5,921,773 A | 7/1999 | Lee | 423/258 |
| 5,931,666 A | 8/1999 | Hengst | 432/258 |
| 6,033,215 A * | 3/2000 | Ohsawa | 432/258 |
| 6,056,123 A * | 5/2000 | Niemirowski et al. | 206/454 X |
| 6,099,302 A * | 8/2000 | Hong et al. | 211/41.18 X |
| 6,145,673 A * | 11/2000 | Burrows et al. | 211/41.18 |
| 6,225,594 B1 * | 5/2001 | Zehavi | 118/728 X |
| 6,237,979 B1 * | 5/2001 | Korn et al. | 211/41.18 X |
| 6,276,592 B1 | 8/2001 | Jochmann et al. | 228/121 |

\* cited by examiner

SILICON FIXTURES FOR SUPPORTING WAFERS DURING THERMAL PROCESSING

RELATED APPLICATIONS

This application is related to Ser. No. 09/608,291 concurrently filed on Jun. 30, 2000.

BACKGROUND OF THE INVENTION

1. Field of the Invention

The invention relates generally to fixtures used for supporting wafers in the fabrication of semiconductor integrated circuits. In particular, the invention relates to silicon fixtures, such as towers and boats, for supporting wafers during thermal processing.

2. Technical Background

In the evolution of commercial fabrication of silicon wafers, larger and larger wafers are being processed in larger and larger batches at the same time that feature sizes are decreasing to 0.18 μm and less. Such processing has imposed increasingly more demanding requirements on the performance of processing equipment, as well as that of the wafer handling and carrying mechanisms needed to move, transport, and retain the wafers during processing. These requirements include temperature uniformity and contamination, whether of impurities and/or particles.

In many chemical and thermal processing operations, it is often necessary to hold the wafers in precise positions during various processing steps, and in particular during annealing, dopant diffusion, or chemical vapor deposition simultaneously performed on many wafers. Many of these processes are performed at moderately high to very high temperatures. The medium temperatures are in the range of 400 to 700° C. while the high temperatures are in the range of 1000 to 1380° C. The upper limit is substantially limited by the melting point of silicon at about between 1412° C. and 1416° C., further taking into account any significant softening at just below the melting point.

Support fixtures are typically employed to support a relatively large quantity of wafers in an oven or other high-temperature reactor for such thermal processing. A "boat" is the term usually applied to a fixture holding multiple wafers with their principal surfaces extending in approximately vertical planes with the wafers spaced along a horizontal axis. A boat is used in a horizontal furnace. A "tower" is the term usually applied to a fixture holding multiple wafers with their principal surfaces lying within generally horizontal planes with the wafers spaced along a vertical axis. A tower is used in a vertical furnace. The term "tower" will be used in the following discussion because they are most common in large-scale commercial fabrication processes, but most of the comments apply equally well to boats.

In the past, most towers and boats have been formed of quartz, which is relatively inexpensive and relatively clean. However, quartz will devitrify at higher temperatures to form crystallites. Any such crystallites can be easily dislodged from the amorphous matrix rendering the support fixtures dirty when used at higher temperatures. Also, quartz tends to sag at somewhat higher temperatures, which makes it unsuitable for large structures required for processing a large number of large wafers. Even at lower temperatures, devitrified quartz has a tendency to fracture catastrophically as cracks propagate in the quartz. Data from the fab lines have shown that the number of particles added from a quartz tower increases with the number of runs in a pattern such as that illustrated in FIG. 1. Up to about ten runs, the number of particles increases to a level of about 50 per 200 mm wafer, which is barely tolerable. The particle count is maintained at this level up to about 40 runs, at which point the production of particles quickly becomes unacceptable. In light of these data and anticipated variations in the performance, it has become common practice to substitute a fresh tower after about 30 runs and to discard the old fixture. While this practice may be economically justified in view of the value of processed wafers, it represents a large expense.

As a result, towers for high-temperature applications are often formed of silicon carbide (SiC), which is usually sintered, so devitrification is not a problem, and its melting point is a relatively high 2830° C. However, since sintered silicon carbide is almost always contaminated with metals, it is common to coat the sintered SiC with a thin layer of SiC deposited by chemical vapor deposition (CVD), which is much cleaner. The CVD coating makes SiC fixtures much more expensive. Also, even a single pinhole in the CVD coating is likely to render the entire tower unusable.

Suggestions exist in the literature for forming towers from silicon. By fabricating wafer holding structures from the same material as the wafers themselves, that is, silicon, the possibility of contamination and deformation is reduced. The silicon structure would react to processing temperatures, conditions, and chemistry in exactly the same way that the wafers would, thus greatly enhancing the overall effective useful life of the structure. Silicon is widely available in the larger sizes required for towers as either monocrystalline or polysilicon grown by the Czochralski (CZ) method.

Czochralski monocrystalline silicon is the type used as wafers in semiconductor integrated circuits and consists of essentially a single crystal of silicon. The Czochralski single crystals are called ingots and are shaped generally as rods with diameters of extending to 200 and 300 mm, the sizes of the most commercially important wafers, and lengths of 1 m or more. The thin wafers are sawn from the monocrystalline ingot. In the Czochralski method, silicon source material typically in the form of virgin polycrystalline silicon to be described later is heated in a crucible to above silicon's melting point of about 1416° C., perhaps with intentionally introduced dopants. A single crystal of silicon is nucleated on a small seed crystal placed at the surface of the melt, and the growing ingot is very slowly pulled from the melt in the form of a single-crystal rod.

CZ polycrystalline silicon, often referred to as semi-single crystal silicon, is grown by substantially the same method and has virtually the same local structure as monocrystalline silicon but is composed of separate crystallites of substantial sizes. The crystallites have sizes of the order of 1 mm to above 100 mm and are separated by grain boundaries. Such CZ polysilicon is believed to be the conventionally presented polysilicon in the context of structural members. Whether CZ silicon is grown in monocrystalline or polycrystalline form depends in large part upon its drawing rate from the melt.

CZ silicon, whether monocrystalline or polycrystalline, is typically grown with heavy metal impurities of somewhat less than 1 part per million (ppm), but carbon and nitrogen may be present in concentrations between 1 and 7 ppm, while oxygen is present in concentrations between 10 and 25 ppm. The crystallites of CZ polysilicon typically have very similar orientations with respect to each other. Polysilicon is often grown as thin layers in silicon integrated circuits by chemical vapor deposition, but such films are not directly applicable to the invention.

To date, however, such silicon towers have not found acceptance in the industry. Silicon is perceived as being extremely fragile and difficult to fuse. Other methods of securing together silicon pieces are unlikely to survive the highest required wafer processing temperatures. It is believed that the standard assembly techniques used with silicon members have been unsatisfactory and has resulted in flimsy structures unsuited to commercial use. Due to these perceptions, known silicon structures are widely believed to be delicate at best, and unreliably flimsy at worst. Consequently, they have failed to receive broad commercial acceptance.

It can be seen that a need exists for a method of fabricating monocrystalline and polycrystalline silicon structural members for use in the manufacture of semiconductor wafers and the like that will eliminate the disadvantages of known silicon structures while retaining the advantages of silicon as a structural material.

It can thus be seen that the need exists for clean, strong, and reliable support members for wafer processing fixtures that will reduce shadowing and contamination while providing stable and precise wafer support.

Ranaan and Davis in U.S. patent applications Ser. Nos. 09/292,491, 09/292,495, and 09/292,496, all filed on Apr. 15, 1999 and now issued as U.S. Pat. Nos. 6,225,594, 6,196,211, and 6,205,993 respectively have disclosed silicon towers formed of either monocrystalline or polycrystalline silicon and have further described methods of securing together pieces of the tower. These patents are incorporated herein by reference in their entireties. The present inventions are improvements on those disclosures.

SUMMARY OF THE INVENTION

A silicon fixture, particularly a silicon tower, is used to support multiple silicon wafers in parallel spaced apart relationships during thermal processing. The preferred configuration includes multiple silicon legs joined at their ends to silicon bases. The legs may have lateral slots cut in the legs to form, in the case of vertically extending towers, projecting teeth to support the wafers horizontally or, in the case of vertically extending boats, a rack to hold the wafers vertically.

In one aspect of the invention the legs and preferably also the bases are machined from virgin polysilicon formed by the chemical vapor deposition of silicon, preferably from monosilane. The silicon material advantageously has an impurity concentration of metal components of less than 1 parts per billion and a resistivity of greater than 1000 ohm-cm.

The legs may have a larger back portion and a smaller projecting portion for supporting the wafers, thus minimizing thermal shadowing. The projecting portion may be inclined upwardly at between 1° and 3° and have a level support portion on its end.

The support portion of the legs is advantageously polished to a mirror finish. The projecting portion advantageously supports the wafer at between 69% and 72% of the wafer radius to minimize stress on the wafer.

Virgin polysilicon may be machined after it has been annealed above its plasticizing temperature of 1025° C. or alternatively at more than 100° C. above the thermal CVD temperature used in forming the virgin polysilicon.

Silicon parts are preferably annealed in an oxygen ambient after machining and before joining.

Silicon parts may be joined by applying a spin-on glass composition to the joining surfaces. A spin-on glass includes silicon and oxygen components that are converted to a silicate glass when annealed to above 600° C. Preferably, the joined parts are annealed at above 1025° C.

Advantageously, the annealed joined parts of a wafer support fixture are subjected to sub-surface work damage prior to use in a wafer processing furnace.

DETAILED DESCRIPTION OF THE PREFERRED EMBODIMENTS

Rugged but light silicon towers and other wafer supporting fixtures can be fabricated, but care should be exercised in the type of silicon used, in the processing and machining of silicon, and the type of method used to secure two silicon members together.

Figure 2:
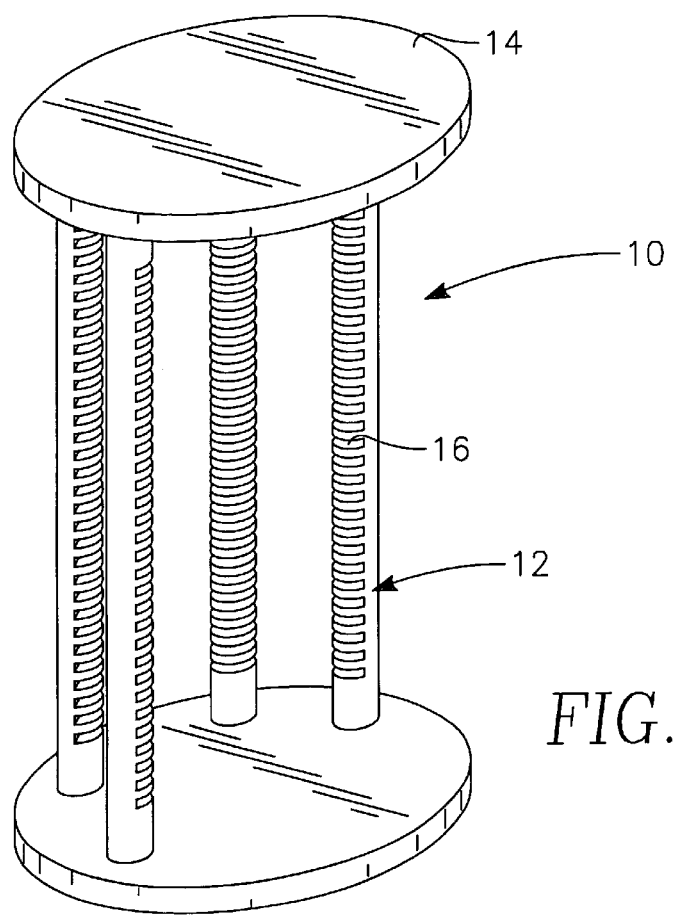
FIG. 2 is an orthographic view of a first embodiment of a silicon wafer processing fixture (tower) incorporating the principles of the present invention.

A silicon wafer tower 10 readily achievable with the invention is illustrated in the orthographic view of FIG. 2. The silicon tower 10 includes a plurality of generally elongate support members 12, hereinafter called legs, secured between a pair of generally planar base members 14, hereinafter called bases. A plurality of horizontal slots 16 are cut into each of the tower legs 12, typically with equal spacings, and are used to support a plurality of wafers in the assembled tower 10. The tower is typically semi-permanently placed in a semiconducting processing reactor (or an adjacent loading station) configured for one of a number of different processes. Multiple wafers are placed into the tower 10 and then simultaneously processed at either medium temperatures in the range of 400 to 700° C. or high temperatures in the range of 1000 to 1380° C., as was previously described. The temperature depends in part on whether chemical vapor deposition, an anneal, or a thermal diffusion is being performed.

The illustrated tower 10 has four legs 12 although three legs 12 and even two legs 12 or possibly one leg 12 would suffice. Most typically, the multiple legs are attached to the bases 14 around slightly more than 180° of the periphery of the bases 14 so that the legs 12 dependably support the wafers but the wafer can be linearly inserted through the slots 16 by an automated robot supporting the wafer on a paddle traveling transversely to the longitudinal axis of the tower 10.

Figure 3:
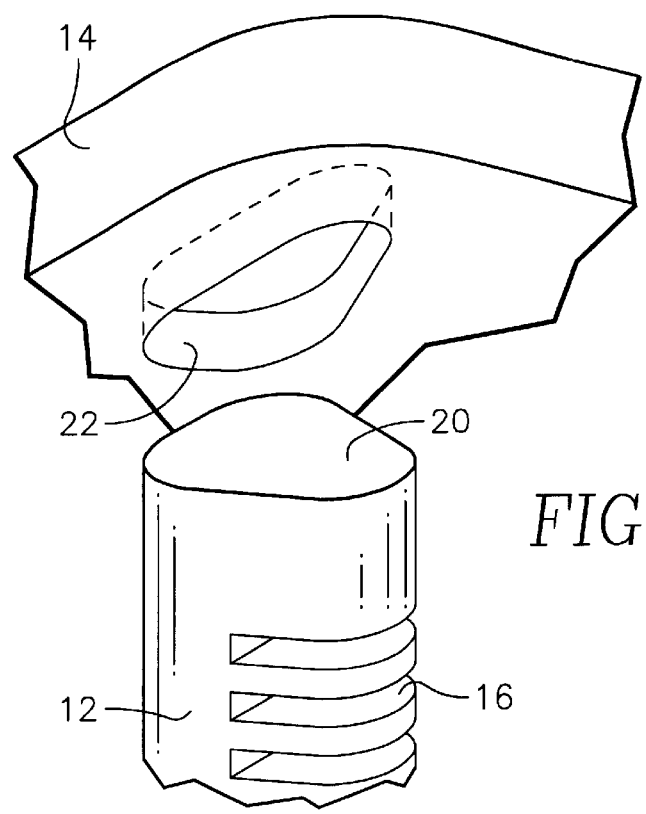
FIG. 3 is an orthographic view of the assembly of a leg and a base of the fixture of FIG. 2.

As shown in the FIG. 3, the legs may have a substantially constant wedge-shaped cross section exclusive of the teeth 16 extending to the leg ends 20. The wafers are supported on the teeth 16 at the more acutely shaped end of the wedge to reduce thermal shadowing. The bases 14 are formed with a similarly shaped blind mortise hole 22, and the rod end 20 is fit into the mortise hole 22 and secured therein. The non-cylindrical shape of the rod end 20 and the mortise hole 22 prevent rotation and thus increase the rigidity and ease of assembly and alignment of the fixture.

Figure 4:
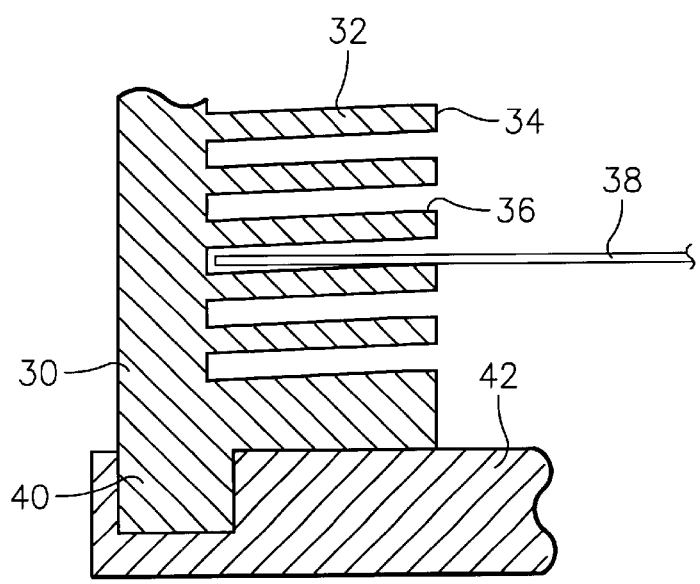
FIG. 4 is a side cross sectional view of a second embodiment of a silicon fixture of the invention.
Figure 5:
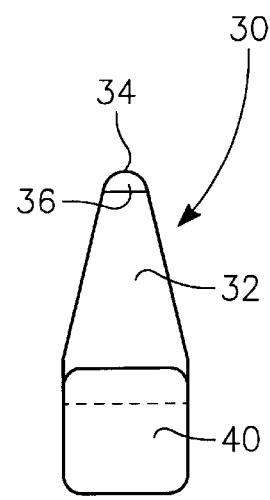
FIG. 5 is an axial plan view of the leg of the silicon fixture of FIG. 4.

An alternate design illustrated in side cross section in FIG. 4 and axial plan view FIG. 5 produces a leg 30 having a shape generally resembling a banjo pick. Each leg has a plurality of teeth 32 having a generally wedge shape with a rounded tip 34. The teeth 34 are sloped upwardly at an angle of between 1 and 3°. However, the top surface of each teeth end 34 is formed with a polished horizontal portion 36 which supports a wafer 38. Again, the small areas of the supporting portion 34 and the surrounding structure reduce thermal shadowing.

Figure 6:
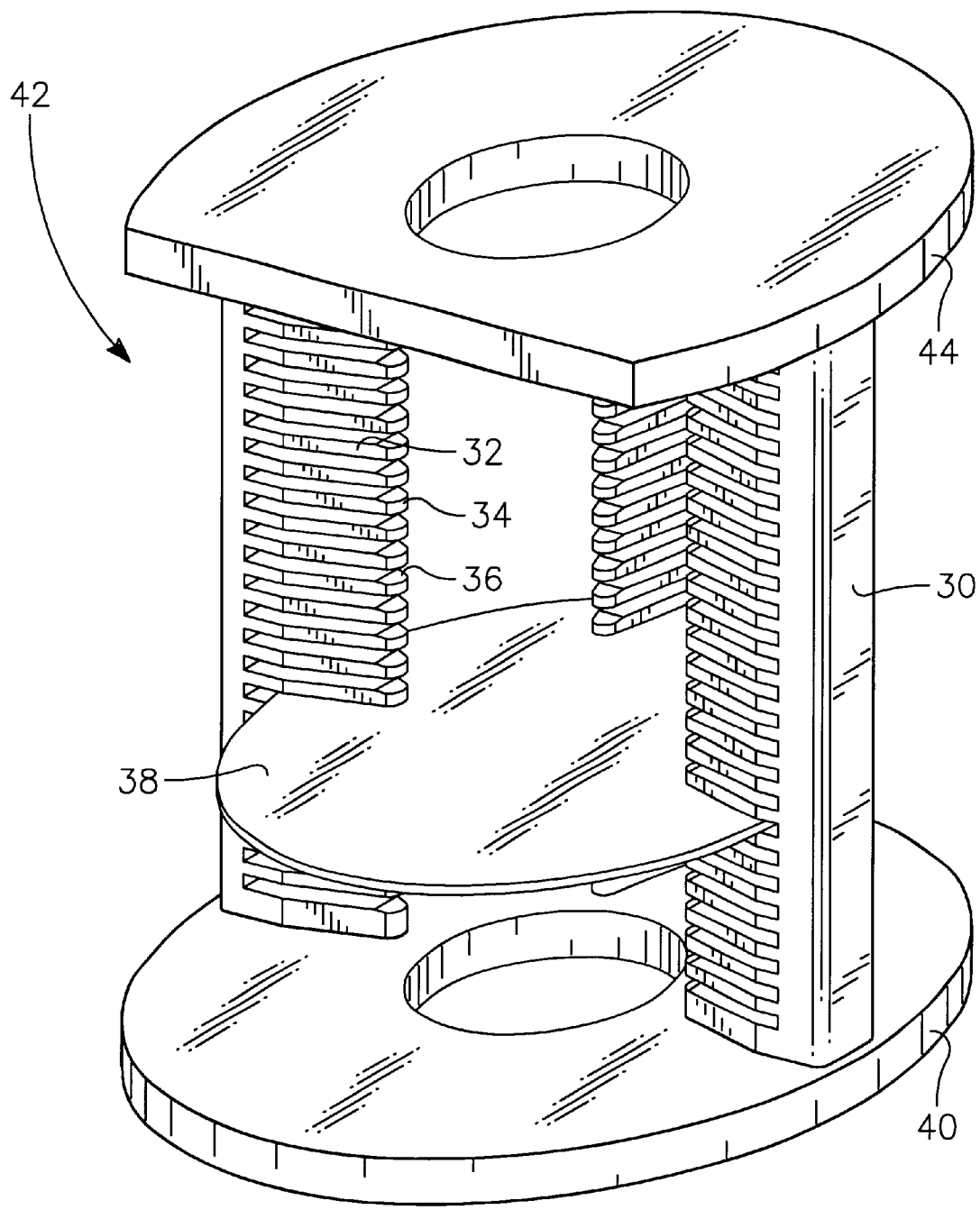
FIG. 6 is an orthographic view of a tower using the leg of FIGS. 4 and 5.

The leg 30 includes at each end a tenon 40 having a rounded rectangular shape that fits into a similarly shaped mortise (blind hole) in a base 42. An assembled tower 42, illustrated in the orthographic view of FIG. 6, includes three of the banjo-pick legs 30 joined at their end to two silicon bases 40, 44 for supporting a plurality of wafers 38 in a vertically offset arrangement.

An advantage of the longer banjo-pick legs 30 is that they can be sized such that the polished support portion 36 at the interior ends of the teeth 32 may be advantageously positioned to support the wafers 38 at a radial position of between 69% and 72% of the radius of the wafer 38. The radial position of $1/\sqrt{2}=0.707$ is the support position at which the weight of the wafer interior to the support radius equals that exterior to it. This balancing has the dual advantage of minimizing maximum wafer sag and of minimizing stress and resultant crystal slip in the supported wafer.

According to one aspect of the invention, some of the members, particularly the legs 12, are formed of virgin polysilicon rather than Czochralski-grown monocrystalline or polycrystalline silicon.

Virgin polysilicon, hereinafter virgin poly, is a special type of polysilicon extensively manufactured for use in the semiconductor industry. Virgin poly is formed into relatively large ingots (diameters of up to approximately 15 cm) by thermal chemical vapor deposition (CVD) of silicon using various one of various silanes as the precursor gas which condenses on a heated seed rod drawn from a previously formed virgin poly ingot or formed into filaments by a float zone process. The virgin poly nucleates from the polycrystalline in the form of a hot seed rod and in the CVD process tends to form as crystalline arms or dendrites radiating from the seed rod with the appearance of a sun burst. Silane precursors for virgin poly include $SiH_4$, $SiClH_3$, $SiCl_2H_2$, $SiCl_3H$, and $SiCl_4$. Of these, $SiHCl_3H$ is the most commonly used commercially, but monosilane ($SiH_4$) is sometimes used based on its historic usage in float-zone deposition. Typical thermal CVD temperatures range from 900° C. to 1100° C. The major commercial suppliers of virgin poly are M.E.M.C., Inc., Hemlock Semiconductor, Advanced Silicon Materials, Inc., Mitsubishi, Wacker of Germany, and Tokuyama of Japan.

Virgin poly is the stock silicon material used to form the melt in the CZ process. It is grown with very high internal stress so that it easily shatters into small pieces to be melted as the CZ precursor.

Virgin poly is grown to very high levels of purity with metal impurity concentrations of $10^{-10}$ cm$^{-3}$ or less. Analyses have been made of a standard grade virgin poly having a maximum concentration for boron of 60 ppt (ppt being 1 part per trillion atomic, $1\times10^{-12}$), for phosphorous of 140 ppt, for metals (such as Al, Ga, In, As, and Sb) of 20 ppt, and for carbon of 20 ppm (parts per million). Thus, even with some variation, the metal concentration is less than 1 ppb (parts per billion atomic). For ultra-pure virgin poly, these maximum concentrations are reduced to 20 ppt, 25 ppt, 10 ppt and 10 ppm. Resistivity of standard grade virgin poly has been measured to be above 1000 ohm-cm, and that of ultra-pure virgin poly above 5000 ohm-cm. This contrasts with Czochralski-grown polysilicon having various impurities of at least 100 ppb for heavy metals. Oxygen may be present in the virgin poly silicon but in amounts many orders of magnitude less than that required for forming silica. References herein to silicon members refer to members comprising a bulk material of substantially pure elemental silicon that is primarily tetrahedrally and covalently bonded together on an atomic scale.

Because virgin poly has very low levels of impurities, it is advantageously used in the legs 12, 30 which are in direct contact with the wafer during thermal processing. This advantage obtains even at the medium processing temperatures at which quartz has no softening problem. Long rods of virgin poly of length greater than the length of the legs are readily available.

Figure 1:
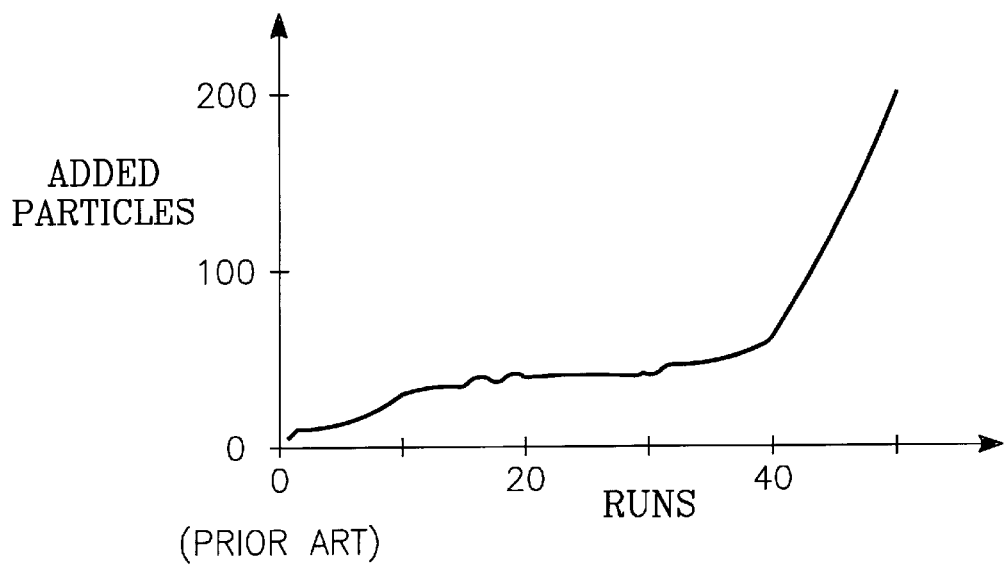
FIG. 1 illustrates the increasing number of particles produced by a quartz tower under continued use.

On the other hand, the bases 14, 40 are relatively far removed from the wafers being processed so that they produce less wafer contamination. It would still be advantageous to form bases from virgin poly. However, in the generally cylindrical forms of the bases 14 of FIG. 1, the diameter of the base 14 must be greater than the diameter of the wafer being processed. Virgin poly is not generally available in ingots of diameter greater than 200 mm as would be required for solid bases for processing 200 mm wafers, much less 300 mm wafers. The largest currently available diameter for virgin poly is about 150 mm. Accordingly, the generally circular bases 14 are conveniently formed of single crystal silicon although CZ polysilicon would suffice. Ingots of CZ monocrystalline silicon are available with very large diameters for speciality applications.

As far as is known, virgin poly has not been used in silicon fixtures for supporting wafers in semiconductor processing. Due to the crystal structure of virgin poly, rods of the material distinct "grain" running generally longitudinally through the rod. Silicon rods are usually cut laterally, across the grain, using a scroll saw. Unfortunately, when used to make longitudinal cuts, conventional cutting techniques tend to split virgin poly rods along the grain, thus ruining the rod.

Virgin poly as delivered from its usual manufacturers is thus inappropriate for being machined into the complex shapes needed for legs and other structural members. Furthermore, the high internal stress present in commercially available virgin poly causes it to shatter or at least chip when subjected to the usual machining processes such as cutting, milling, turning, and slotting.

Figure 7:
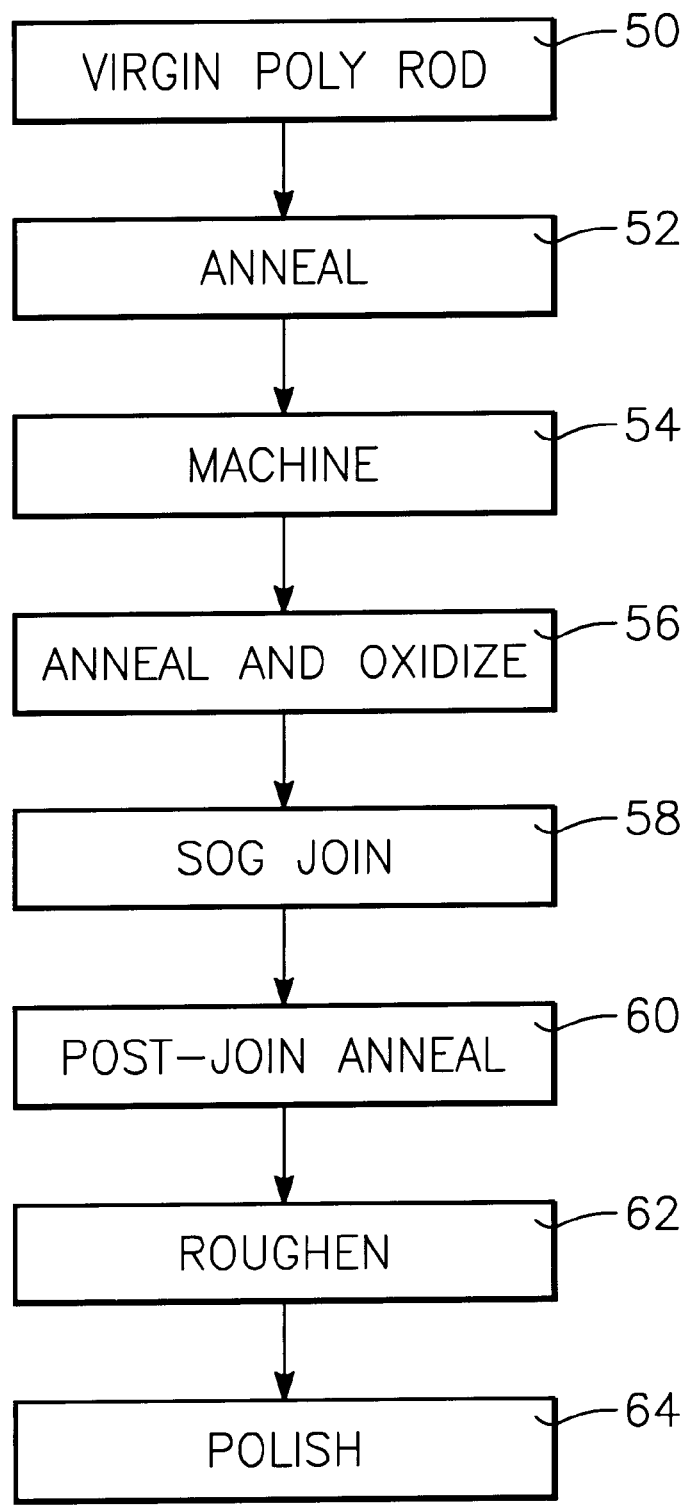
FIG. 7 is a process flow diagram of a method of fabricating a virgin polysilicon structure.

As a result, a more complex processing sequence, such as that illustrated in FIG. 7 is advantageously followed in forming virgin poly members, such as the legs, and assembling them into more complex structures. In step 50, a virgin poly rod is provided. Preferably, the virgin poly is formed by a CVD process using monosilane ($SiH_4$) since this precursor is free from any possible contaminants, such as chlorine. In the case of fabricating legs, the virgin poly rod should have a length greater than that required for the legs, and its diameter is advantageously somewhat more than twice the maximum transverse dimension of the legs to maximize the material utilization of the cylindrical virgin poly rods. In step 52, the virgin poly ingot is annealed for more than an hour at a temperature at least above 1025° C, which is the plasticizing temperature for silicon, and below its melting point of 1414°±2° C. The annealing temperature should be at least 100° C. above the temperature used in the CVD deposition temperature of the rod. Thus a minimum annealing temperature of 1200° C. would suffice for the known sources of virgin poly. The annealing relieves the internal strain of virgin poly but is not believed to significantly change its crystalline structure.

In step 54, the annealed virgin poly rod is machined into its desired shape. Because of the annealing step 52, standard machining procedures may be followed without undue concern of fracturing the virgin poly. The first two machining steps should cut it to the desired length and turn the rod to remove the typically present surface doming, to thus provide a smooth cylindrical rod. Subsequent machining steps include longitudinal sectioning the cylindrical rod into wedge-shaped stock members and machining the wedges into the desired leg shape. It has been found that sectioning of the rods may be performed with a hydraulic jet, and the teeth may be cut with a rotary slotter. Other types of machining can be used for producing the relatively complex shapes described here.

In step 56, the machined members, for example, the legs and the bases, even if they are Czochralski silicon, are annealed at between 1025 and 1416° C. in an atmospheric ambient so that the machined silicon is oxidized.

In step 58, the legs are joined to the bases. The preferred joining technique uses a thinned spin-on glass (SOG). SOG is a generic term for chemicals widely used in semiconductor fabrication to form silicate glass layers in integrated circuits. Commercial suppliers include Allied Signal, Filmtronics of Butler, Pa., and Dow Corning. SOG includes one or more chemicals containing both silicon and oxygen, such as tetraethylorthosilicate (TEOS) or its modifications or organo-silanes such as siloxanes. It is preferred that the SOG not contain boron or phosphorous, as is commonly done for integrated circuits. The silicon and oxygen containing chemical is dissolved in an evaporable carrier, such as alcohol, methyl isobutyl ketone or a volatile methyl siloxane blend. In semiconductor fabrication, a few drops of relatively viscous SOG are dropped onto a wafer, and the wafer is spun at high speeds to create a uniformly thin layer of the SOG. Thereafter, the coated wafer is annealed at between 200 and 900° C., and the SOG decomposes to form silicate glass having the approximate composition $SiO_2$. In the joining step 58 of the invention, the SOG is thinned with the addition of more solvent, and is coated to sufficient thickness on either or both of leg tenon and the base mortise to fill the void between the leg and base after they have been assembled together into the tower structure.

In step 60, the assembled tower is again annealed of at least 200° C. for the SOG cure and preferably at between 1025 and 1414° C., which is sufficient to vitrify the SOG and bond together the two oxidized silicon parts. Although a 200° C. cure is sufficient for many SOGs, an anneal at between 600 and 900° C. provides superior SOG vitrification in the restricted geometry of the bonded interface, and the temperatures above 1025° C. provide better bonding to the oxidized surfaces and relieve structural distortions.

In step 62, the assembled tower is subjected to a surface treatment which introduces controlled sub-surface damage in the underlying silicon. Such treatments were practiced previously to roughen the backside of wafers to getter impurities from the wafer. Treatment methods include bead blasting, lapping, and grinding among several possibilities.

In step 64, the wafer bearing surfaces 34 are polished to a mirror finish, preferably having a surface roughness of less than 1 nm but a 10 nm roughness would be acceptable. A chemical mechanical polishing (CMP) method used for polishing wafers can be adapted for polishing the more confined wafer bearing surfaces. Two typical CMP methods include use of a colloidal silica polishing agent in an alkali liquid carrier or of a diamond paste in either a liquid carrier or impregnated in a flexible polishing belt. Hengst in U.S. Pat. No. 5,931,666 references an ASTM standard for numerical value of surface roughness. Alternatively, a mirror surface can be visually determined by viewing the surface. A mirror surface looks like a silvered mirror, though perhaps of a different color, in that it reflects light at equal angles from the normal of the surface. Any significant defects, texture, or speckling indicates a lack of a mirror surface.

The present invention enables the fabrication of monocrystalline silicon, polycrystalline silicon, or virgin polysilicon structural members for use in the manufacture of semiconductor wafers and the like, and is applicable to any large scale and/or complex fixture or part used in the processing of silicon wafers. Experience has shown that silicon fixtures reduce the number of added particles, see FIG. 1, to less than 10 per 200 mm wafer, and there is no long-term degradation in this performance.

Figure 8:
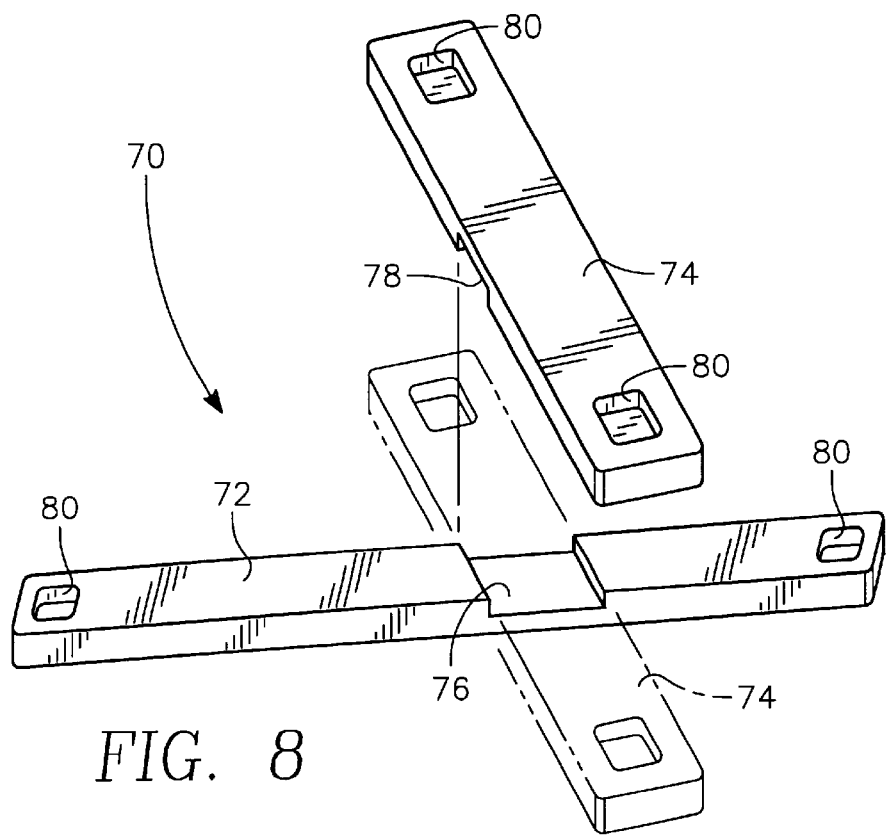
FIG. 8 is an orthographic view of a multi-part tower base.

The invention is not limited to the tower of the general configuration illustrated in FIG. 2. Alternatively, as illustrated in the orthographic view of FIG. 8, a tower base 70 may be fabricated from two silicon cross legs 72, 74 formed with matching central notches 76, 78. The cross legs 72, 74 arranged at an angle to each other are then joined together at the notches 76, 78 in the manner of Lincoln logs. Because the side legs of the tower are arranged along about 210° of a circle to allow both the support and insertion of wafers, the cross legs 72, 74 have longer and shorter ends with respect to the notches 76, 78, and the ends of the same size are set at an obtuse angle between them. Each of the cross legs 72, 74 includes blind mortise holes 80 at its ends to receive the tenons of the side legs of the tower. Advantageously, the cross legs 72, 74 are formed of virgin polysilicon, and an entire virgin poly tower is formed and joined according to the forming process of FIG. 7.

Other configurations of a base is possible in which two or more silicon members are joined together and with the silicon legs.

Figure 9:
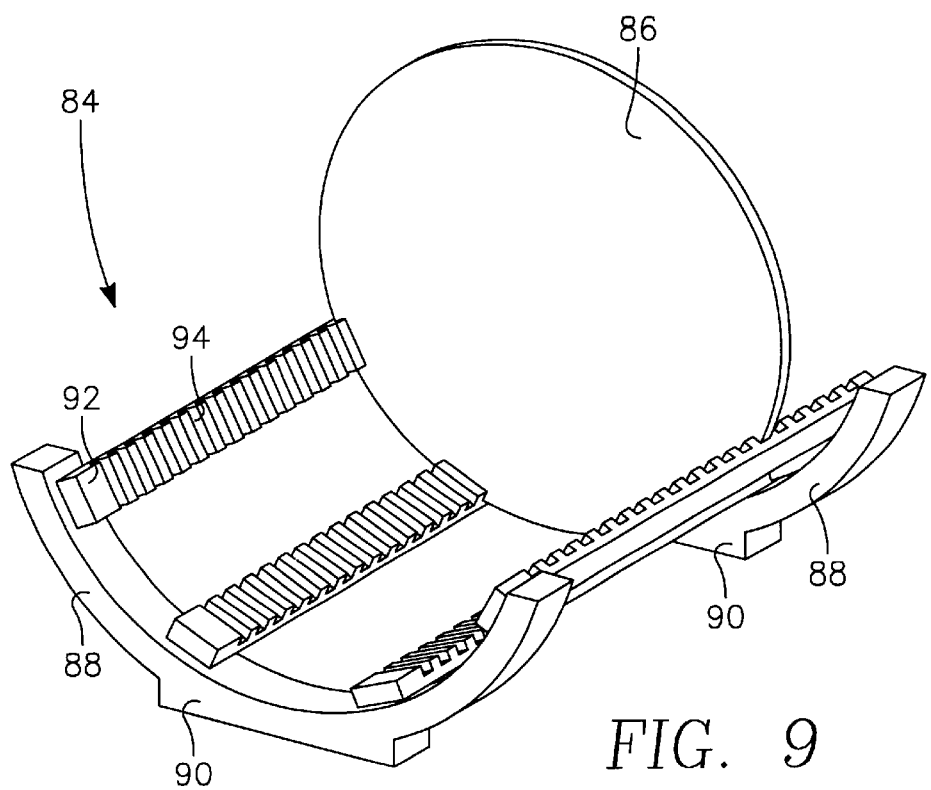
FIG. 9 is an orthographic view of a horizontally arranged fixture (boat).

The invention can be usefully applied to a wafer boat 84 illustrated in the orthographic view of FIG. 9 for supporting multiple wafers 86 held substantially vertical and spaced along a horizontal direction. The boat 84 of this embodiment includes two arc-shaped silicon end bases 88 with feet 90 supporting the boat 84 within a horizontal furnace. The boat 84 also includes four silicon arms 92 (which would be called legs for a tower orientation). Vertical slots 94 are cut in the arms 92 to receive the wafers. The ends of the arms 92 are joined to the end bases 88. Once again, advantageously, the entire boat 84 is composed of virgin polysilicon, and the virgin poly boat is formed and joined according to the method of FIG. 7. For a boat, the number of arms 92 can be reduced, even to two arms. Indeed, it is possible to provide a boat function by cutting multiple parallel slots in a single longitudinally silicon member to form a rack, advantageously composed of virgin polysilicon.

Components using structural members in accordance with the present invention experience less deformation during high-temperature process applications. Since the source material is the same quality as the wafers material, particulate contamination, crystal slip, and metallic contaminants inherent with known materials such as silicon carbide is virtually eliminated. Furthermore, thermal shadowing is reduced since, for the described towers, the wafer is supported on a narrow tooth ends and since the fixture material and wafer material have substantially identical physical properties and critical constants. Silicon fixtures and parts manufactured according to the described methods have tolerances and expected service life unachievable with fixtures made from commonly used materials such as quartz or silicon carbide. The present invention enables the fabrication of silicon parts and fixtures that provide advantages as the industry moves to 300 mm and larger wafer diameters.

The virgin poly legs have the advantage of extremely low impurities of no more than 10 ppt. Therefore, the virgin poly tower introduces far fewer impurities into the wafers being processed. However, it is noted that the quoted impurity levels for virgin poly are affected, at least near the surface, by the machining and ambient annealing steps. Nonetheless, at depths of greater than approximately 10 $\mu$m, the lower impurity levels are maintained and the deep volume does not constitute a source of impurities.

Although the invention has been described with reference to wafer towers, virgin poly may be advantageously used with other parts in silicon processing chambers, whether in direct contact with a wafer, such as paddles and lift pins for transferring wafer and pedestals for supporting single wafers, or other parts of the chamber such as gas jets. Also, the joining method of the invention may be advantageously applied to these other parts. Further, the combination of annealing and machining may be applied to other virgin poly parts not limited to semiconductor fabrication.

Although the present invention has been described with reference to specific embodiments, those of skill in the art will recognize that changes may be made thereto without departing from the scope and spirit of the invention.

What is claimed is:

1. A silicon fixture for supporting a plurality of wafers, comprising:
   two bases composed of silicon; and
   a first plurality of legs composed of virgin polysilicon secured at their two ends to said two bases and configured to removably support a plurality of wafers in parallel relationships.

2. The fixture as recited in claim 1, wherein each of said legs have a plurality of slots cut into a first side thereof to form teeth for supporting said plurality of wafers and allowing said wafers to be slidably inserted into said slots.

3. The fixture as recited in claim 2, wherein each of said legs is formed according to a cross-sectional leg shape including said first side which has a curved shape with a first radius, no portion of said leg shape having a radius of curvature less than said first radius.

4. The fixture as recited in claim 2, wherein said leg shape includes a second side opposed to said first side and having a curved shape with a second radius greater than said first radius.

5. The fixture as recited in claim 2, wherein said leg shape includes a flat second side opposed to said first side.

6. The fixture as recited in claim 1, wherein said legs include ends thereof having a non-circular shape.

7. The fixture as recited in claim 6, further comprising holes having said non-circular shape formed in said bases to receive said legs.

8. The fixture as recited in claim 7, wherein the non-circular shape differs from a cross-sectional shape of said legs in a central portion thereof into which said slots are cut.

9. The fixture as recited in claim 1, wherein each of said bases comprises virgin polysilicon.

10. The fixture as recited in claim 1, wherein each of said bases comprises monocrystalline silicon.

11. A silicon fixture for supporting a plurality of wafers, comprising:
   two bases, each comprising a plurality of silicon parts secured together; and
   a first plurality of legs comprising silicon and secured at their two ends to said two bases and configured to removably support a plurality of wafers.

12. The silicon fixture as recited in claim 11, wherein each of said legs includes a plurality of slots cut into a side thereof for supporting said plurality of wafers and allowing said wafers to be slidably inserted into said slots.

13. The silicon fixture as recited in claim 11, wherein said bases and said legs are composed of virgin polysilicon.

14. A silicon tower for supporting a plurality of wafers vertically offset from each other, comprising:
   at least two silicon legs each having a plurality of teeth formed therein projecting from a longitudinal axis of said each leg for supporting a plurality of wafers thereupon and having on opposed ends of said each leg two non-cylindrical attachment parts; and
   two silicon bases having respective non-cylindrical holes formed therein for receiving and surrounding said attachment parts of said legs, wherein said bases are joined to said legs through said holes and attachment parts.

15. The tower of claim 14, wherein said legs comprise virgin polysilicon.

16. The tower of claim 14, wherein said teeth are formed by slots cut into each leg at an angle of between 87° and 89° from said longitudinal axis, said slots extending upwardly toward bottoms of said wafers being supported.

17. The tower of claim 16, wherein a support portion of each of said teeth contacting one of said supported wafers is polished to a mirror finish.

18. The tower of claim 16, wherein a support portion of said slot contacting said supported wafer is positioned at a radial position of between 69% and 72% of a radius of said supported wafer.

19. A silicon tower for supporting a plurality of wafers, comprising:
   two silicon bases; and
   at least three silicon legs extending along respective longitudinal axes, joined to said bases and having teeth projecting therefrom having wafer supporting portions polished to mirror finish.

20. The tower of claim 19, wherein said wafer supporting portions are polished to a roughness of no more than 10 nm.

21. The tower of claim 20, wherein said roughness is no more than 1 nm.

22. The tower of claim 20, wherein said legs comprises virgin polysilicon.

23. A support member for wafer processing fixtures, comprising:
   an elongate silicon body portion having a cross-sectional body shape including an arcuate front surface with a first radius of curvature and a back surface opposed to said front surface and being either flat or having a second radius of curvature greater than said first radius of curvature, no other portion of said body shape having a radius of curvature less than said first radius of curvature; and a plurality of mutually parallel wafer-retaining slots formed in the front surface of the body portion.

24. The support member according to claim 23, wherein said back surface is curved and a ratio of said second radius to said first radius is at least 3.

25. The support member according to claim 23, wherein said back surface is flat.

26. The support member according to claim 23, wherein said silicon member comprises virgin polysilicon.

27. The support member according to claim 23, wherein said silicon member comprises monocrystalline silicon.

28. A member configured for use in a chamber for processing silicon wafers comprising virgin polysilicon.

29. The member of claim 28, wherein said virgin polysilicon has portions having an impurity level of metal components of less than 1 part per billion.

30. The member of claim 29, wherein said virgin polysilicon has portions having an electrical resistivity of at least 1000 ohm-cm.

31. The member of claim 29 configured for supporting at least one wafer.

32. The member of claim 31 configured to support a plurality of wafers in parallel relationships.

33. A member configured to support at least one substrate in a substrate processing chamber and comprising silicon having portions having an impurity level of metal components of less than 1 part per billion.

34. The member of claim 33 configured as a tower to support a plurality of substrates.

35. The fixture as recited in claim 1, wherein each of said bases comprises Czochralski silicon.

36. The silicon fixture as recited in claim 11, wherein said legs are composed of virgin polysilicon.

37. The support member according to claim 23, wherein said silicon member comprises Czocharlaski silicon.

38. A silicon tower for supporting a plurality of wafers vertically offset from each other, comprising:

two silicon bases; and at least three silicon legs extending along respective axes secured at opposed ends to said two bases and each having a plurality of teeth formed therein principally extending along a direction inclined with respect to a perpendicular of a respective one of said axes, a distal corner of each of said teeth being formed with a substrate support surface extending substantially perpendicular to said respective one of said axes.

39. The silicon tower of claim 38, wherein said teeth are formed to extend at an angle of between 87° and 89° with respect to said respective one of said axes.

40. The silicon tower of claim 38, wherein said legs are formed of virgin polysilicon.

41. The silicon tower of claim 38, wherein said substrate support surfaces are polished to a mirror finish.

42. The silicon tower of claim 38, wherein said substrate support surfaces are polished to a roughness of no more than 10 nm.

43. The silicon tower of claim 42, wherein said roughness is no more than 1 nm.

44. The silicon tower of claim 14, wherein said attachment part is smooth sided.

45. A silicon boat for supporting a plurailty of substrates horizontally offset from each other, comprising:

at least two arms composed of virgin polysilicon each having a plurality of slots formed therein for supporting said plurality of substrates; and two silicon bases supporting and fixed to opposed ends of said at least two arms when said arms extend horizontally.

46. The silicon boat of claim 45, wherein said two bases are composed of virgin polysilicon.

47. The silicon boat of claim 45, comprising four of said arms.

* * * * *